United States Patent
Dervay

(10) Patent No.: US 12,506,442 B1
(45) Date of Patent: Dec. 23, 2025

(54) OFFSET-MIXER INTERFEROMETRIC NOISE SUPPRESSED OSCILLATOR (INSO)

(71) Applicant: Raytheon Company, Arlington, VA (US)

(72) Inventor: James Andrew Dervay, Hudson, MA (US)

(73) Assignee: Raytheon Company, Arlington, VA (US)

( * ) Notice: Subject to any disclaimer, the term of this patent is extended or adjusted under 35 U.S.C. 154(b) by 0 days.

(21) Appl. No.: 18/749,187

(22) Filed: Jun. 20, 2024

(51) Int. Cl.
*H03B 5/20* (2006.01)
*H03L 7/099* (2006.01)

(52) U.S. Cl.
CPC ............... *H03B 5/20* (2013.01); *H03L 7/099* (2013.01)

(58) Field of Classification Search
CPC .................................. H03B 5/20; H03L 7/099
USPC ...... 331/117 D, 135, 107 DP, 10, 12, 16, 34; 342/172; 455/207; 375/264
See application file for complete search history.

(56) References Cited

U.S. PATENT DOCUMENTS

| | | | |
|---|---|---|---|
| 5,150,080 A * | 9/1992 | Bianchini | H03L 7/02 331/175 |
| 5,841,322 A | 11/1998 | Ivanov et al. | |
| 7,075,378 B2 | 7/2006 | Howe et al. | |
| 9,350,293 B1 | 5/2016 | Desrochers et al. | |
| 12,009,826 B1 * | 6/2024 | Shtin | H03L 7/093 |
| 2004/0198295 A1 * | 10/2004 | Nicholls | H04B 1/525 455/296 |
| 2005/0007204 A1 * | 1/2005 | Howe | H03L 7/00 331/107 DP |

* cited by examiner

*Primary Examiner* — Arnold M Kinkead
(74) *Attorney, Agent, or Firm* — Schwegman Lundberg & Woessner, P.A.

(57) ABSTRACT

An offset-mixer INSO provides a fixed phase shift in the reference arm of the interferometric bridge to align the reference arms' variable phase shifter to the mixer's I-channel output and uses the variable phase shifter to amplitude balance the reference and reflection arms. A difference signal between the mixer's Q-channel output and an externally applied carrier frequency tuning voltage $V_{PLL}$ is applied to an amplification network to provide the control signal to the loop phase shifter to adjust the carrier frequency. Elimination of the variable attenuator and rotation of the variable phase shifter eliminates and reduces their respective phase noise contributions such that the dominant phase noise source is now the mixer.

20 Claims, 6 Drawing Sheets

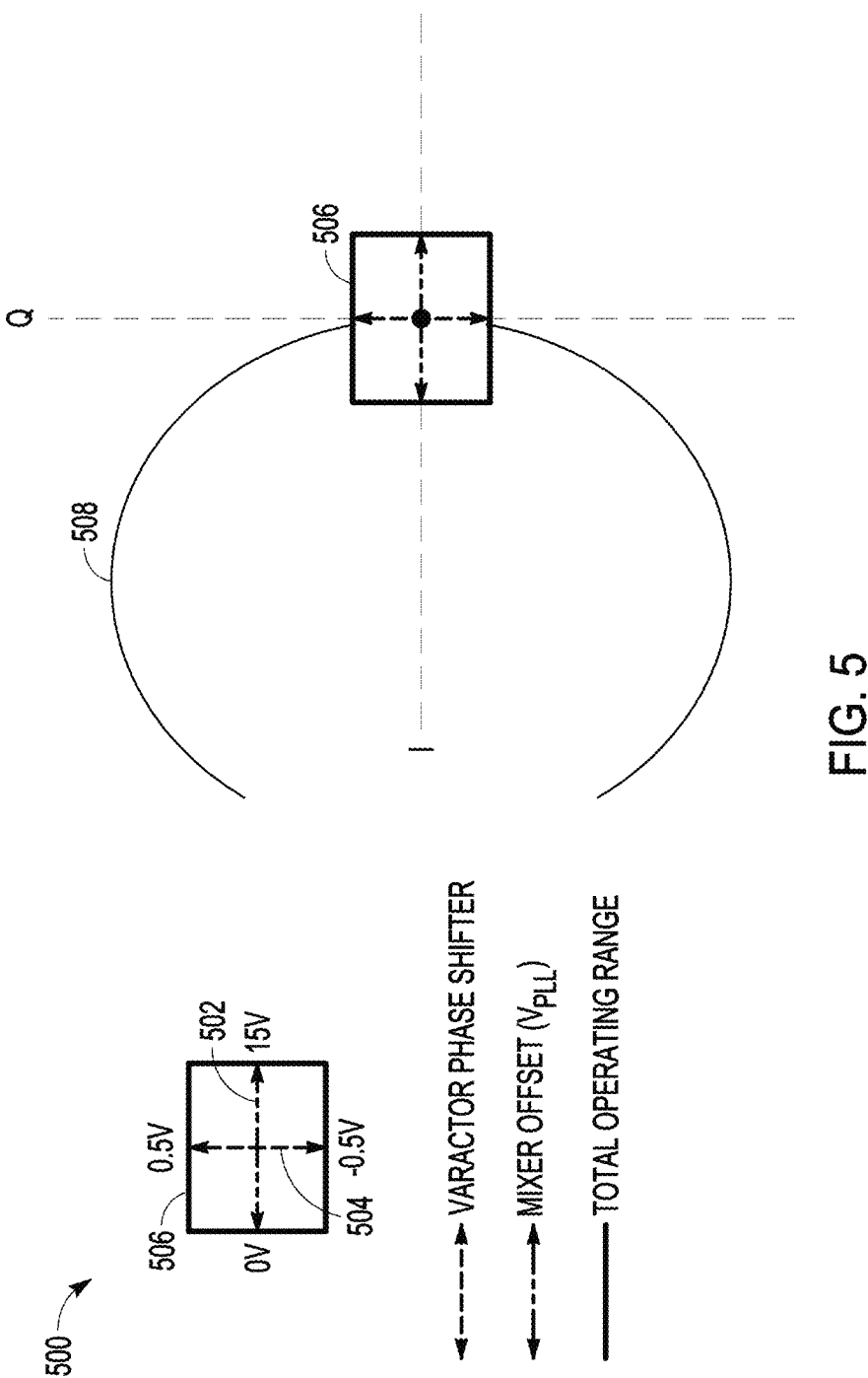

US 12,506,442 B1

OFFSET-MIXER INTERFEROMETRIC NOISE SUPPRESSED OSCILLATOR (INSO)

BACKGROUND

Field

This disclosure relates to loop oscillators and more particularly to the reduction of phase noise in interferometric noise suppressed oscillators (INSOs).

Description of the Related Art

Phase noise is an important property of oscillators in general and low phase noise oscillators find application in precision timing and radar systems, for example. In mobile applications, such as mobile radars, oscillators are often subjected to mechanical vibrations. An oscillator's phase noise is determined by phase noise contributions of individual components such as attenuators, phase shifters, mixers or low noise amplifiers (LNAs). The component with the largest phase noise contribution is identified as the dominant noise source. The oscillator may be designed to minimize the dominant noise source.

A particular class of oscillator, often selected for use in high fidelity systems may be referred to as an Interferometric Noise Suppressed Oscillator (INSO). An INSO may utilize a sapphire-loaded cavity as the resonator and incorporate a noise degeneration circuit to suppress phase noise. Examples of an INSO are described in U.S. Pat. No. 5,841,322 entitled "Phase Detector Using Carrier Suppression and Oscillator Using the Phase Detector" issued Nov. 24, 1998; U.S. Pat. No. 7,075,378 entitled "High Spectral Purity Microwave Oscillator Using Air-Dielectric Cavity" issued Jul. 11, 2006 and U.S. Pat. No. 9,350,293 entitled "Amplitude-Noise Reduction System and Method for Ultra-Low Phase-Noise Oscillators" issued May 24, 2016.

Referring now to FIG. 1, in a simplified schematic of a phase-locked INSO 100 the basic oscillator comprises a sustaining amplifier 102, a loop phase shifter 104 and a resonator 106, such as a sapphire-loaded cavity, configured as a simple loop oscillator. One skilled in the art will understand that other components not directly relevant to the discussion have been omitted for simplicity. A phase detector 108 is used to detect frequency fluctuations in the oscillator loop by using a mixer 124 to compare the resonator's incident signal to its reflected signal, generating phase and amplitude error signals 110 and 111. Phase error signal 110 is amplified (and possibly filtered) by a PI network 113 before being fed back into the loop phase shifter 104 to cancel the phase noise in the loop and suppress close-in phase noise near the carrier frequency. PI network suitably applies the phase error signal 110 to a feedback amplifier 114 and an integrator 170 whose outputs are summed via summer 172 into the loop phase shifter input.

Phase detector 108 includes an interferometric bridge 116 including a reference arm having a coupler 128 that couples a portion 131 of a first signal 118 at the carrier frequency that propagates around the loop and a reflection arm including a circulator 134 (or directional coupler) that couples a portion 151 (all or some) of a second signal 120 that is a reflection of first signal 118 off of resonator 106 to produce a carrier suppressed signal 122. The reference and reflection arms each having a carrier phase and amplitude. To maintain balance in the interferometer, the signals from both reference and reflection arms must arrive at a combiner 136 with the same amplitude but out of phase so that cancellation occurs. Hence, any phase shift in the reference arm is matched by an equal and opposite phase shift in the reflection arm signal due to the action of the feedback. Combiner 136 produces carrier suppressed signal 122 that is fed to a low noise amplifier 138 that amplifies the carrier suppressed signal 122. The interferometric bridge includes the reference and reflection arms, the combiner 136 and the LNA 138.

Phase detector 108 includes a mixer local oscillator (LO) coupler 140 that couples a portion 141 of first signal 118 from the loop that is fed through a mixer LO variable phase shifter 142 to produce a phase-shifted LO signal 143 and the mixer 124.

Mixer 124, such as an I/Q mixer as shown or equivalent a pair of AM and PM mixers, is responsive to the amplified carrier suppressed signal 122 and phase-shifted LO signal 143 to produce the phase and amplitude error signals 110 and 111 at its Q and I-channel outputs. Ideally, the Q-ch output is purely phase and the I-ch output is purely amplitude. The LO variable phase shifter 142 is tuned to align the Q-channel output to the reflection arm's carrier phase and the I-channel output to the reflection arm's carrier amplitude.

The reference arm includes a fixed phase shifter 129 (often implemented as a drop-in phase length or "DIPL"), a variable attenuator 130 and a variable phase shifter 132. Fixed phase shifter 129 provides a phase shift of 0-360 degrees selected to align the variable attenuator 130 to the I-channel output. Variable attenuator 130 is responsive to the I-channel output via a feedback network such as a bridge balance error integrator 125 to nullify the I-channel output. The fixed phase shift is suitably adjusted to ensure that the variable attenuator 130 is maximally responsive to the I-channel. Variable phase shifter 132 is aligned to the Q-channel output, which is sensitive to the reflection arm's phase.

To phase-lock the INSO, Phase Lock Loop (PLL) circuitry 150 is responsive to an output signal 152 extracted from the oscillator loop via coupler 154 and a reference signal 156 to produce a PLL tuning signal, $V_{PLL}$ that is externally applied to the tuning port of phase shifter 132 in the reference arm of the interferometric bridge. The phase shift induced in the reference arm by $V_{PLL}$ imposes a phase error at the mixer Q-channel output and the feedback network responds by changing the loop oscillation frequency and nullifying the phase error such that the oscillator frequency is locked to the reference signal frequency. The tuning slope $K_{VCO1}$ associated with phase shifter 132 is not constant over the applied tuning range. The overall magnitude of $K_{VCO1}$ and its resulting total tuning range is dependent on the operating point of the reference arm attenuator. The closed-loop characteristics of the PLL are sensitive to variations in $K_{VCO1}$ and these variations may degrade stability, lock time, and noise peaking.

As shown in FIG. 2, the INSO exhibits a reference arm bridge tuning constellation 200, which is defined by a tuning range 202 (e.g., 0-15 V) of the variable attenuator 130 along one axis and a tuning range 204 (e.g., 0-15 V) of variable phase shifter 132 along another axis orthogonal to the first to define a total operating range 206. The 0-360 phase shift provided by fixed phase shifter 129 aligns the reference arm bridge tuning constellation 200 to the amplitude/phase of the resonator's reflection (i.e., the resonator reflection locus 208). The phase shift provided by LO phase shifter 142 aligns the mixer's I/Q axes to the combined reflection+reference arm. Ideally, the Mixer Q channel is maximally sensitive to the resonator's phase/frequency slope for PM noise suppression. Actuation of the reference arm variable phase shifter 132 results in a change purely in the Q axis, which also tunes perfectly along the resonator's frequency. The Mixer I channel is maximally sensitive to the resonator's AM response for AM noise suppression. Actuation of the reference arm variable attenuator 130 results in a pure amplitude change for I-channel nullification feedback. In practice, finite phase misalignments in the LO arm phase shifter and the reference arm fixed phase shifter cause cross-axis noise contamination and reduced sensitivity.

As shown in FIG. 3, a phase noise 300 of the INSO and more particularly the phase noise of the interferometric bridge has contributions from multiple sources. The component with the largest phase noise contribution is identified as the dominant noise source. The LNA has a phase noise contribution 302 that is relatively constant and low over offset frequency. The interferometric bridge suppresses power at the LNA to reduce its flicker noise. The mixer, variable phase shifter and variable attenuators each have a phase noise contribution 304, 306 and 308 that increases at lower offset frequency. Often the mixer phase noise contribution 304 is the lowest and the reference arm variable phase shifter contribution 306 and the variable attenuator contribution 308 are the highest and thus the domination phase noise source for the INSO.

The variable attenuator is typically a PIN diode design. PIN diodes typically have higher intrinsic noise levels than varactor diodes (the variable phase shifter). The variable attenuator has a non-zero phase slope over its actuation range. Therefore, its actuation bias noise has a direct phase noise contribution. Additionally, there is always some axial misalignment of the LO arm phase shifter and reference arm fixed phase shifter, resulting in variable attenuator AM to PM contamination. This all contributes to a high phase noise contribution 308.

The phase noise contribution 306 of the phase shifter is high because it is in direct alignment with the Q channel PM noise suppression axis. All of its intrinsic and bias induced noise contributes directly to the net PM noise level.

The mixer's intrinsic flicker noise is dependent on its operating LO power level. The mixer's conversion gain is also dependent on its operating LO power level. This creates a trade-off effect and the resulting phase noise contribution 304 is fixed within its practical operating range. The mixer phase noise contribution level is low with respect to the reference arm contributions because the LNA amplifies the reference arm noise contributions.

SUMMARY

The following is a summary that provides a basic understanding of some aspects of the disclosure. This summary is not intended to identify key or critical elements of the disclosure or to delineate the scope of the disclosure. Its sole purpose is to present some concepts of the disclosure in a simplified form as a prelude to the more detailed description and the defining claims that are presented later.

The present disclosure an offset-mixer architecture for an INSO to reduce phase noise in the interferometric bridge.

An offset-mixer INSO provides a fixed phase shift in the reference arm of the interferometric bride to align the reference arm's variable phase shifter to the mixer's I-channel output and uses the variable phase shifter to amplitude balance the reference and reflection arms. A difference signal between the mixer's Q-channel output and an externally applied carrier frequency tuning voltage $V_{PLL}$ is applied to an amplification network to provide the control signal to the loop phase shifter to adjust the carrier frequency. Elimination of the variable attenuator and rotation of the variable phase shifter eliminates and reduces their respective phase noise contributions such that the dominant phase noise source is now the mixer.

In an embodiment, an offset-mixer INSO includes an oscillator loop that produces a first signal at a carrier frequency and a second signal as a reflection of the first signal. A phase detector includes an interferometric bridge having reference and reflection arms responsive to the first and second signals, respectively, that combines them to produce a carrier suppressed signal, a LO variable phase shifter responsive to the first signal to produce a phase-shifted LO signal, and an I/Q mixer responsive to the carrier suppressed signal and the phase-shifted LO signal to generate I and Q-output channels. A fixed phase shift aligns a variable phase shifter in the reference arm to the mixer's I-channel output. The reference arm's variable phase shifter is responsive to the I-channel output to nullify the mixer's I-channel output. An amplification network is responsive to a difference signal between the mixer's Q-channel output and an externally applied carrier frequency tuning voltage $V_{PLL}$ to provide a control signal to the oscillator loop to adjust the carrier frequency.

In an embodiment, an INSO includes an amplifier, a loop phase shifter responsive to a control signal, and a resonator arranged in a loop to oscillate and produce a first signal at a carrier frequency, a second signal produced by reflection of a portion of the first signal by the resonator. A interferometric bridge includes a reference arm responsive to a first portion of the first signal and a reflection arm responsive to a portion (some or all) of the second signal which combine to produce a carrier suppressed signal. A LO variable phase shifter is responsive to a second portion of the first signal to produce a phase-shifted LO signal. An I/Q mixer is responsive to the carrier suppressed signal and the phase-shifted LO signal to produce I and Q channel outputs as amplitude and phase error signals, respectively, of the reflection arm. The LO variable phase shifter is tuned to align the Q-channel output to the reflection arm's carrier phase and the I-channel output to the reflection arm's carrier amplitude. The reference arm includes a fixed phase shifter and a variable phase shifter. The fixed phase shifter provides a phase shift to align the reference arm's variable phase shifter to the I-channel output. The variable phase shifter is responsive to the I-channel output to nullify the I-channel output. A control signal generator includes an amplification network that amplifies a difference signal between Q-channel output and an externally applied carrier frequency tuning voltage $V_{PLL}$ to provide the control signal to the loop phase shifter to adjust the carrier frequency thereby producing a different reflection phase that appears on the Q-channel output to drive the difference signal towards zero.

In an embodiment, $V_{PLL}$ imposes a non-zero offset on the Q-channel output.

In an embodiment, the reference arm variable phase shifter nullifies the I-channel output by forcing opposite phase on the reference and reflection arms to drive a power of carrier suppression signal towards zero.

In an embodiment, the mixer exhibits a linear response over a tuning range of the carrier frequency. The tuning range is fixed regardless of a reference arm variable phase shifter operating point.

In an embodiment, a feedback network, analog or digital, is connected between the mixer's I-channel output and an input to the reference arm variable phase shifter. The feedback network suitably includes an integrator that integrators the I-channel output.

In an embodiment, the amplification network comprises a feedback amplifier and an integrator whose outputs are summed to provide the control signal to the loop phase shifter.

In an embodiment, the variable phase shifter is a varactor phase shifter.

In an embodiment, the mixer has a phase noise contribution that is the dominant phase noise contributor for the INSO. The reference arm variable phase shifter has a phase noise contribution whose amplitude exceeds that of the mixer, but because the reference arm's variable phase shifter is aligned with the I-channel and off-axis to the INSO's phase noise in the Q-channel its contribution to the Q-channel is reduced.

In an embodiment, a low noise amplifier (LNA) amplifies the carrier suppressed signal, which is offset from zero. This does increase a phase noise contribution of the LNA. However, the LNA phase noise contribution remains less than the phase noise contribution of the mixer.

In an embodiment, a thermal control loop integrates the mixer offset signal imposed by the external tuning voltage $V_{PLL}$ to adjust the resonator's natural frequency and nullify the Q-channel output, eliminating the degraded phase noise contribution of the LNA.

These and other features and advantages of the disclosure will be apparent to those skilled in the art from the following detailed description of preferred embodiments, taken together with the accompanying drawings, in which:

BRIEF DESCRIPTION OF THE DRAWINGS

FIG. 5 is a diagram illustrating the alignment of the reference arm bridge tuning constellation to the mixer's I and Q-channels in which the variable phase shifter is aligned to the I-channel and the mixer offset is aligned to the Q-channel.

DETAILED DESCRIPTION

An offset-mixer INSO provides a fixed phase shift in the reference arm of the interferometric bridge to align the reference arm's variable phase shifter to the mixer's I-channel output and uses the variable phase shifter to amplitude balance the reference and reflection arms. A difference signal between the mixer's Q-channel output and an externally applied carrier frequency tuning voltage $V_{PLL}$ is applied to an amplification network to provide the control signal to the loop phase shifter to adjust the carrier frequency. Elimination of the variable attenuator and rotation of the variable phase shifter eliminates and reduces their respective phase noise contributions such that the dominant phase noise source is now the mixer.

A variable phase shifter is used instead of a variable to amplitude balance the interferometric bridge. Elimination of the variable attenuator eliminates a dominant phase noise contributor. Rotation of the variable phase shifter reduces another key phase noise contributor. An offset is imposed on the mixer's Q-channel output instead of driving the Q-channel output to zero. Frequency tuning is achieved by applying the tuning voltage as an offset to the amplification network instead of as control input to the variable phase shifter. The tuning range is highly linear and not dependent on the operating point of the variable phase shifter.

Figure 1:
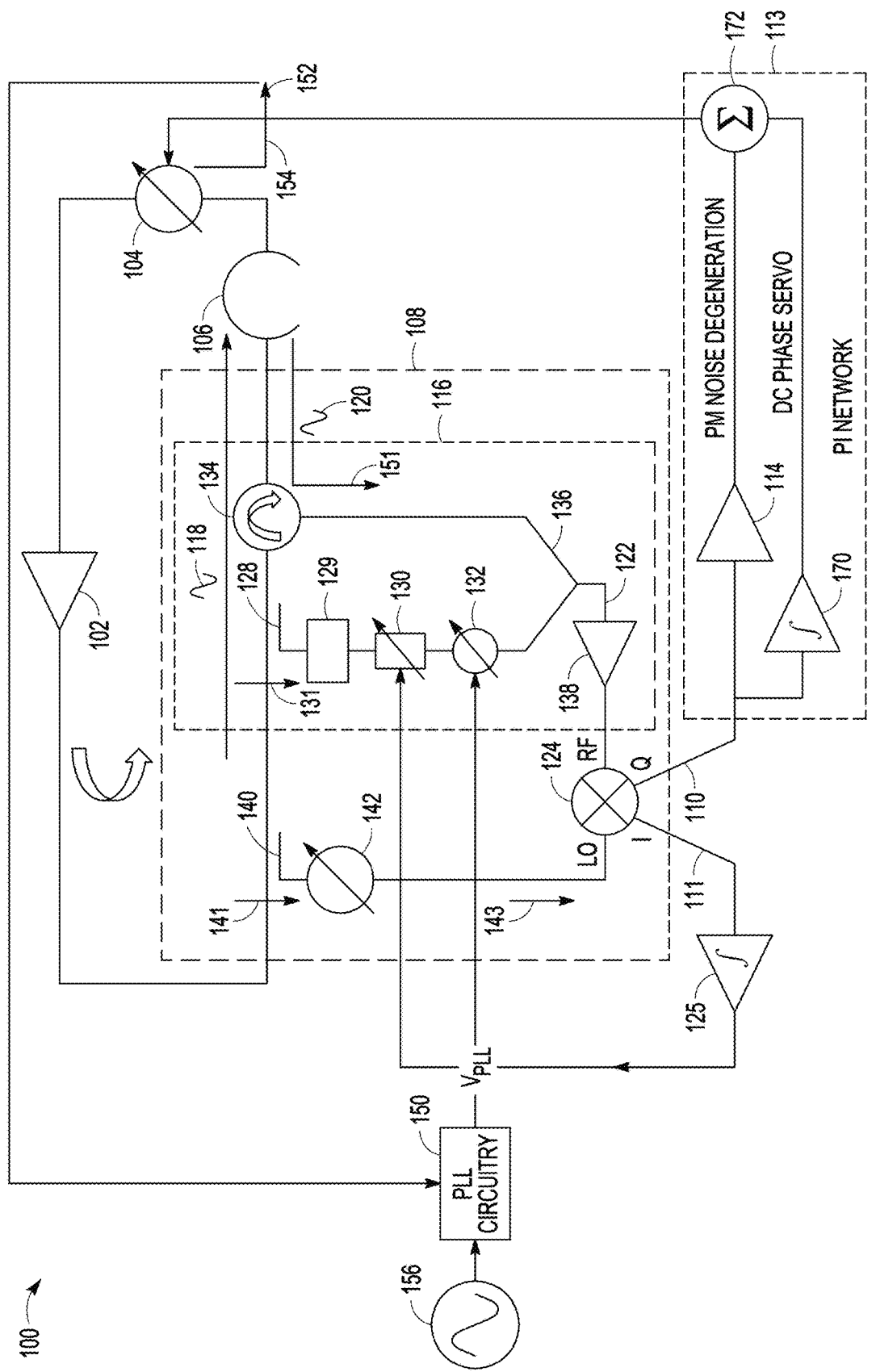
FIG. 1, as described above, is a simplified schematic of an interferometric Noise Suppressed Oscillator (INSO)
Figure 2:
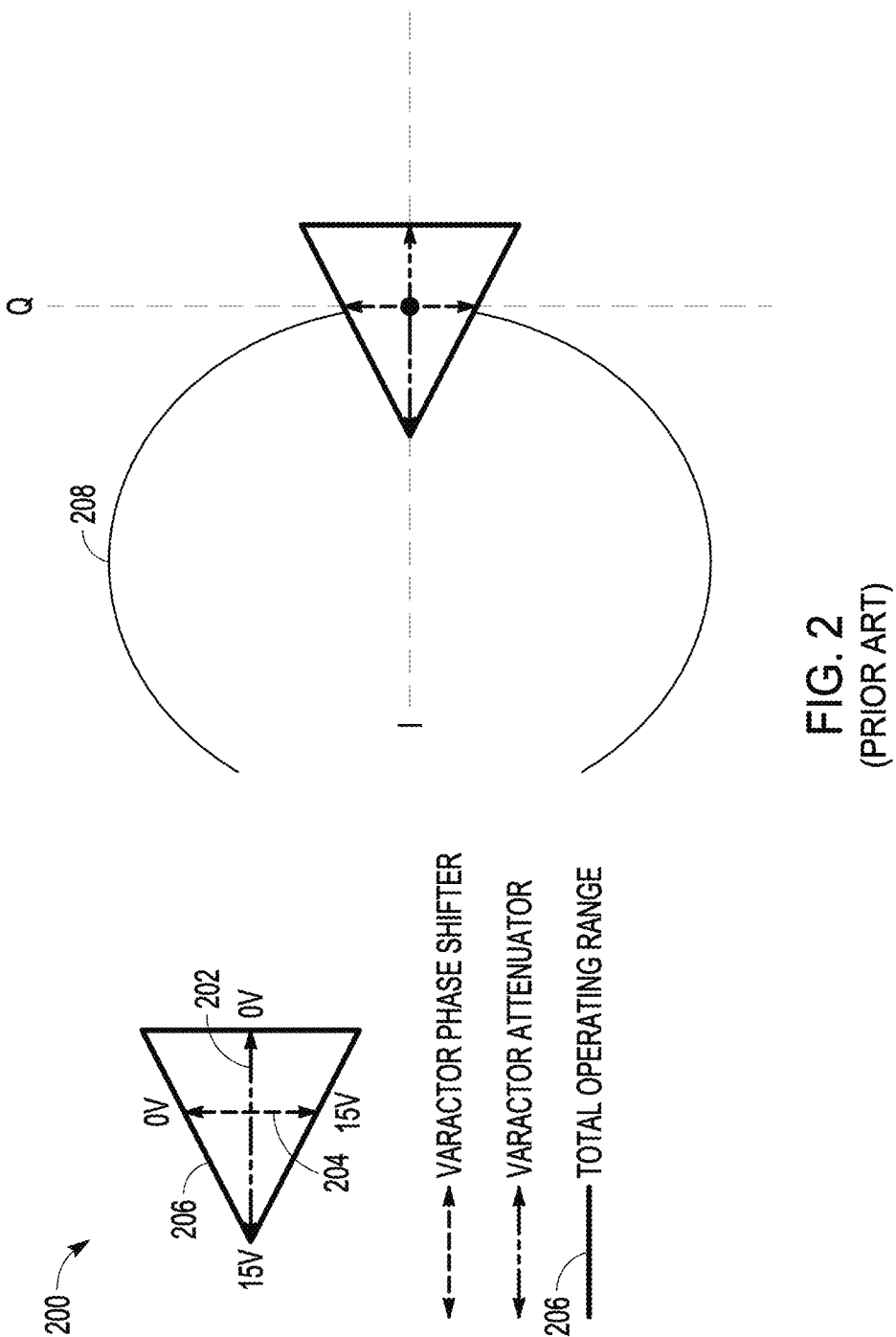
FIG. 2, as described above, is a diagram illustrating the alignment of the reference arm bridge tuning constellation to the mixer's I and Q-channels in which the variable attenuator is aligned to the I-channel and the variable phase shifter is aligned to the Q-channel.
Figure 3:
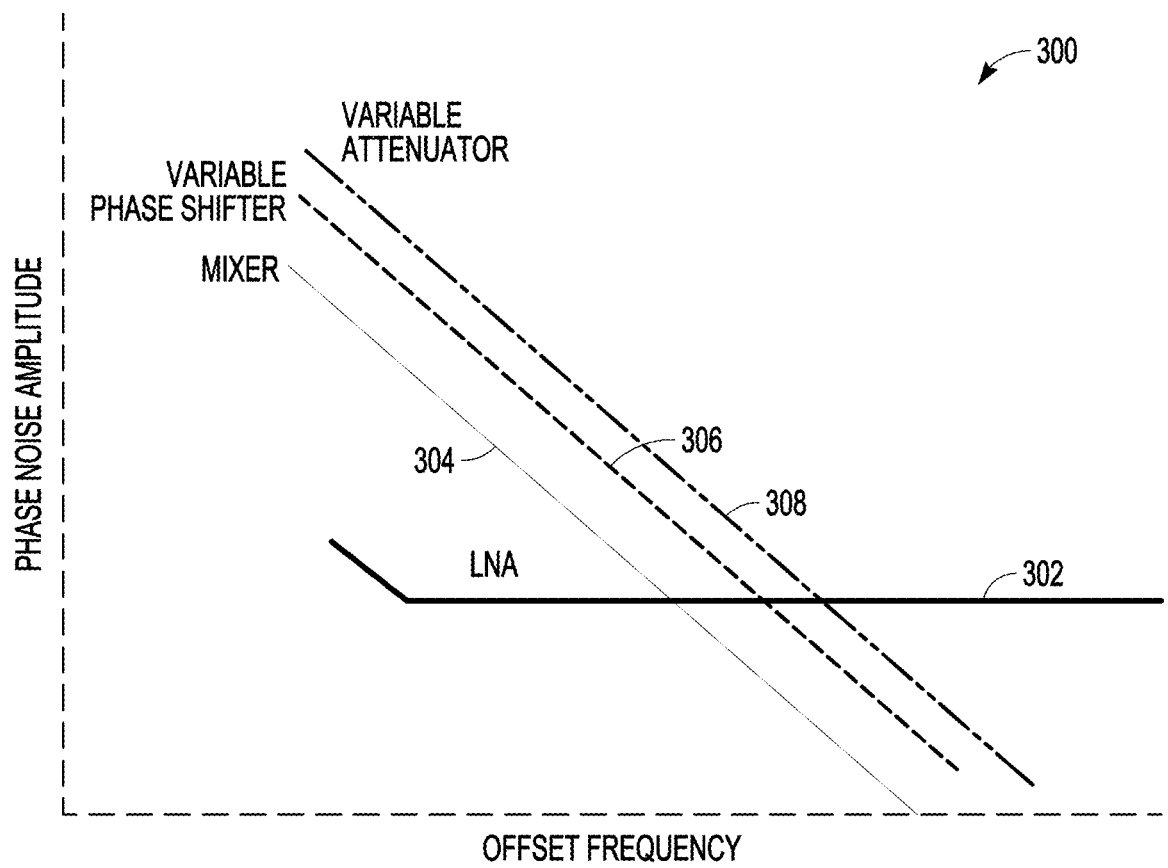
FIG. 3, as described above, is a plot of phase noise amplitude for the INSO's variable attenuator, variable phase shifter, mixer and LNA.
Figure 4:
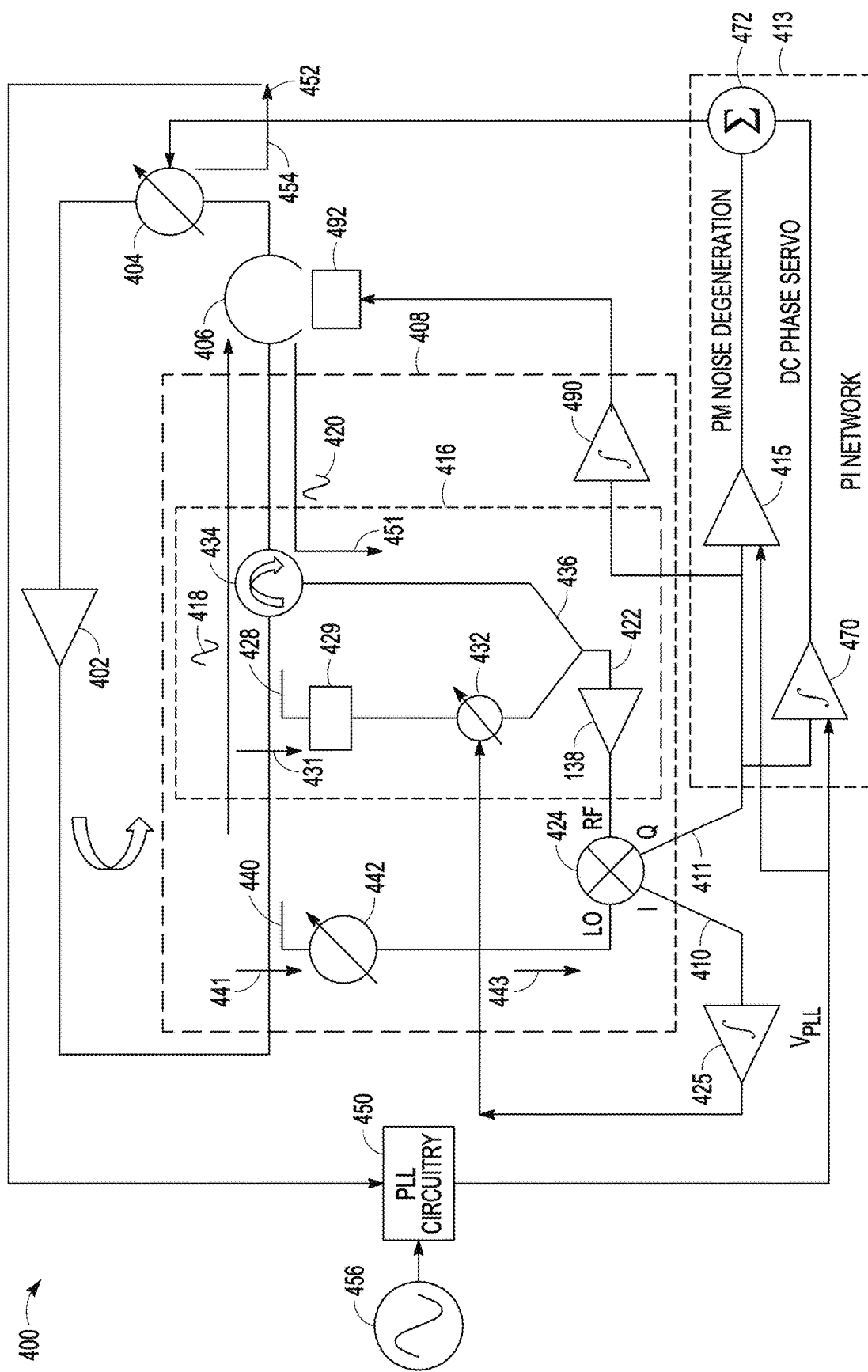
FIG. 4 is a simplified schematic of an offset-mixer INSO configured to reduce phase noise in the interferometric bridge.

Referring now to FIG. 4, in a simplified schematic of a phase-locked INSO 100 the basic oscillator comprises a sustaining amplifier 402, a loop phase shifter 404 and a resonator 406, such as a sapphire-loaded cavity, configured as a simple loop oscillator. One skilled in the art will understand that other components not directly relevant to the discussion have been omitted for simplicity. A phase detector 408 is used to detect frequency fluctuations in the oscillator loop by using a mixer 424 to compare the resonator's incident signal to its reflected signal, generating phase and amplitude error signals 410 and 411. Phase error signal 410 is amplified (and possibly filtered) by a PI network 413 before being fed back into the loop phase shifter 404 to cancel the phase noise in the loop and suppress close-in phase noise near the carrier frequency. PI network suitably applies the phase error signal 410 to a feedback amplifier 414 and an integrator 470 whose outputs are summed via summer 472 into the loop phase shifter input.

Phase detector 408 includes an interferometric bridge 416 including a reference arm having a coupler 428 that couples a portion 431 of a first signal 418 at the carrier frequency that propagates around the loop and a reflection arm including a circulator 434 (or directional coupler) that couples a portion 451 (all or some) of a second signal 420 that is a reflection of first signal 418 off of resonator 406 to produce a carrier suppressed signal 422. The reference and reflection arms each having a carrier phase and amplitude. To maintain balance in the interferometer, the signals from both reference and reflection arms must arrive at a combiner 336 with the same amplitude but out of phase so that cancellation occurs. Hence, any phase shift in the reference arm is matched by an equal and opposite phase shift in the reflection arm signal due to the action of the feedback. Combiner 336 produces carrier suppressed signal 322 that is fed to a low noise amplifier 438 that amplifies the carrier suppressed signal 322. The interferometric bridge includes the reference and reflection arms, the combiner and the LNA.

Phase detector 408 includes a mixer local oscillator (LO) coupler 440 that couples a portion 441 of first signal 418 from the loop that is fed through a mixer LO variable phase shifter 442 to produce a phase-shifted LO signal 443 and the mixer 424.

Mixer 424, such as an I/Q mixer as shown or equivalent a pair of AM and PM mixers, is responsive to the amplified carrier suppressed signal 422 and phase-shifted LO signal 443 to produce the phase and amplitude error signals 410 and 411 at its Q and I-channel outputs. Ideally, the Q-ch output is purely phase and the I-ch output is purely amplitude. The LO variable phase shifter 442 is tuned to align the Q-channel output to the reflection arm's carrier phase and the I-channel output to the reflection arm's carrier amplitude.

The reference arm includes a fixed phase shifter 429 (often implemented as a drop-in phase length or "DIPL") and a variable phase shifter 432 such as a varactor phase shifter. Fixed phase shifter 229 provides a phase shift of 0-360 degrees selected to align the variable phase shifter 432 to the I-channel output. Variable phase shifter 432 is responsive to the I-channel output via a feedback network, analog or digital, such as a bridge balance error integrator 425 to nullify the I-channel output. The fixed phase shift is suitably adjusted to ensure that the fixed phase shifter 429 is maximally responsive to the I-channel.

To phase-lock the INSO, Phase Lock Loop (PLL) circuitry 450 is responsive to an output signal 452 extracted from the oscillator loop via coupler 454 and a reference signal 456 to produce a PLL tuning signal, $V_{PLL}$. $V_{PLL}$ is applied to PI network 413 as an offset to Q-channel error signal 413 to form a difference signal that is amplified to provide the control signal to the loop phase shifter to adjust the carrier frequency thereby producing a different reflection phase that appears on the Q-channel output to drive the difference signal towards zero. $V_{PLL}$ imposes a non-zero offset on the mixer's Q-channel output.

The tuning slope associated with mixer 424 is linear over a tuning range of the carrier frequency and is fixed regardless of the operating point of the reference arm variable phase shifter 432. The applied mixer offset produces an equal frequency shift over its range. This is beneficial because the $V_{PLL}$ slope is a gain term in the PLL closed loop dynamics, which impacts noise peaking, bandwidth, and lock time. Also, the applied $V_{PLL}$ is measured and used to adjust the resonator temperature to maintain the electronic tuning window. Improved $V_{PLL}$ linearity improves the temperature controller stability.

A thermal control loop includes an integrator 490 that integrates the mixer offset signal imposed by the external tuning voltage $V_{PLL}$ to control a thermal actuator 492 (e.g., a heat pump) to change the natural frequency of resonator 406 to nullify the mixer's Q-channel output thereby eliminating the degraded phase noise contribution of the LNA. For example, if the mixer offset signal imposes a 1 KHz shift in the carrier frequency, the thermal control loop adjusts the temperature to change the natural frequency of the resonator by 1 KHz. This allows the mixer offset signal to return to zero thereby eliminating the offset LNA noise contribution.

As shown in FIG. 5, the INSO exhibits a reference arm bridge tuning constellation 200, which is defined by a tuning range 502 (e.g., 0-15 V) of the variable phase shifter 432 along one axis and a tuning range 504 (e.g., 0-15 V) of the mixer offset $V_{PLL}$ along another axis orthogonal to the first to define a total operating range 506. The 0-360 phase shift provided by fixed phase shifter 429 aligns the reference arm bridge tuning constellation 500 to the amplitude/phase of the resonator's reflection (i.e., the resonator reflection locus 508). The phase shift provided by LO phase shifter 442 aligns the mixer's I/Q axes to the combined reflection+ reference arm. Ideally, the Mixer Q channel is maximally sensitive to the resonator's phase/frequency slope for PM noise suppression. Actuation of the reference arm variable phase shifter 432 results in a change purely in the I axis for feedback nullification. The Mixer I channel is maximally sensitive to the resonator's AM response for AM noise suppression. In practice, finite phase misalignments in the LO arm phase shifter and the reference arm fixed phase shifter cause cross-axis noise contamination and reduced sensitivity.

Figure 6A:
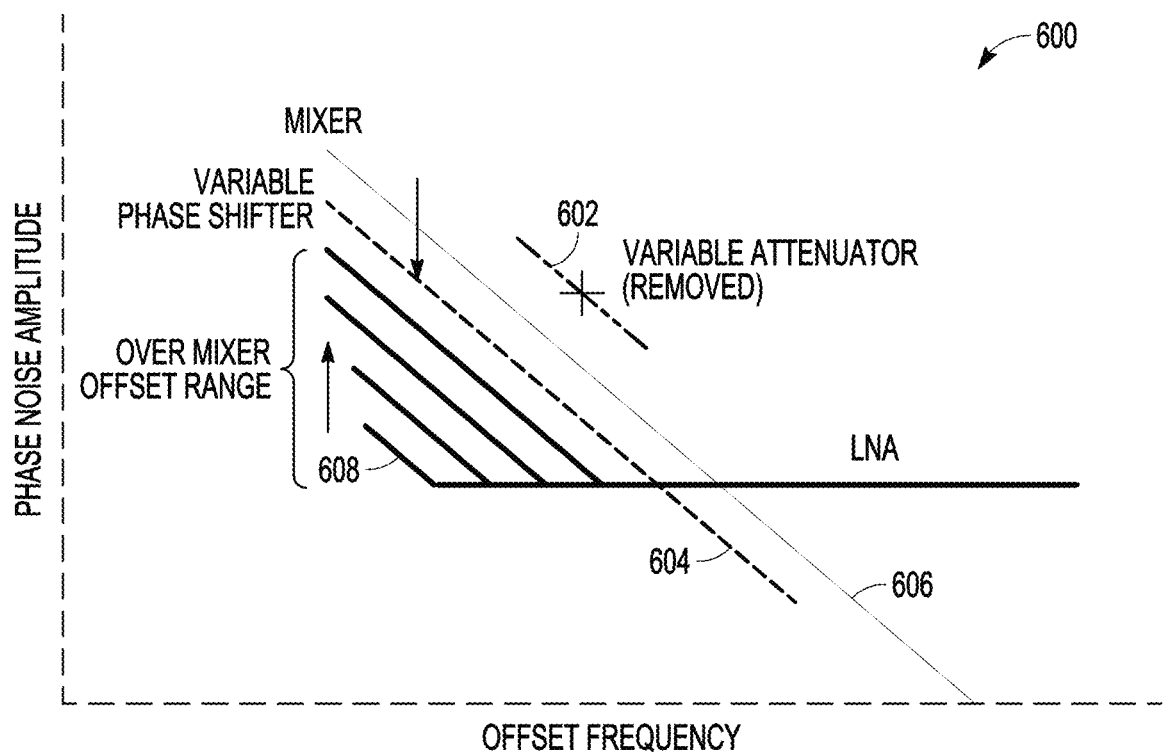
FIG. 6A is a plot of phase noise amplitude for the INSO showing the mixer phase noise contribution as the dominant phase noise contribution and FIG. 6B is a plot comparing the dominant phase noise contribution of the mixer-offset INSO to the known INSO.

As shown in FIG. 6, a phase noise 600 of the INSO and more particularly the phase noise of the interferometric bridge has contributions from multiple sources. The component with the largest phase noise contribution is identified as the dominant noise source. First, elimination of the variable attenuator from the reference arm of the interferometric bridge eliminates that phase noise contribution 602. Second, the reference arm's variable phase shift is not oriented in the Q channel PM noise suppression axis, so it's contribution 604 to the net PM noise level is just it's intrinsic AM noise+bias induced AM noise+PM leakage due to DIPL/LO Phase misalignment, which is lower than the mixer's phase noise contribution 606.

Voltage at either the I or Q channel indicates power at the LNA input. The purpose of the interferometer is to suppress power at the LNA input to reduce its flicker noise, since amplifier flicker noise is dBc with respect to the input power. By allowing a mixer offset, sub-optimal carrier suppression occurs, increasing the LNA's flicker noise contribution 608. For small to moderate offsets, this increase is still too small to be noticed because the mixer flicker noise 606 will still dominate. In stable fixed-frequency applications, large $V_{PLL}$ inputs will typically only appear during PLL closure. Once the system has stabilized, the temperature of the resonator can be adjusted to remove any remaining offset induced by the PLL, eliminating the LNA degradation problem.

Figure 6B:
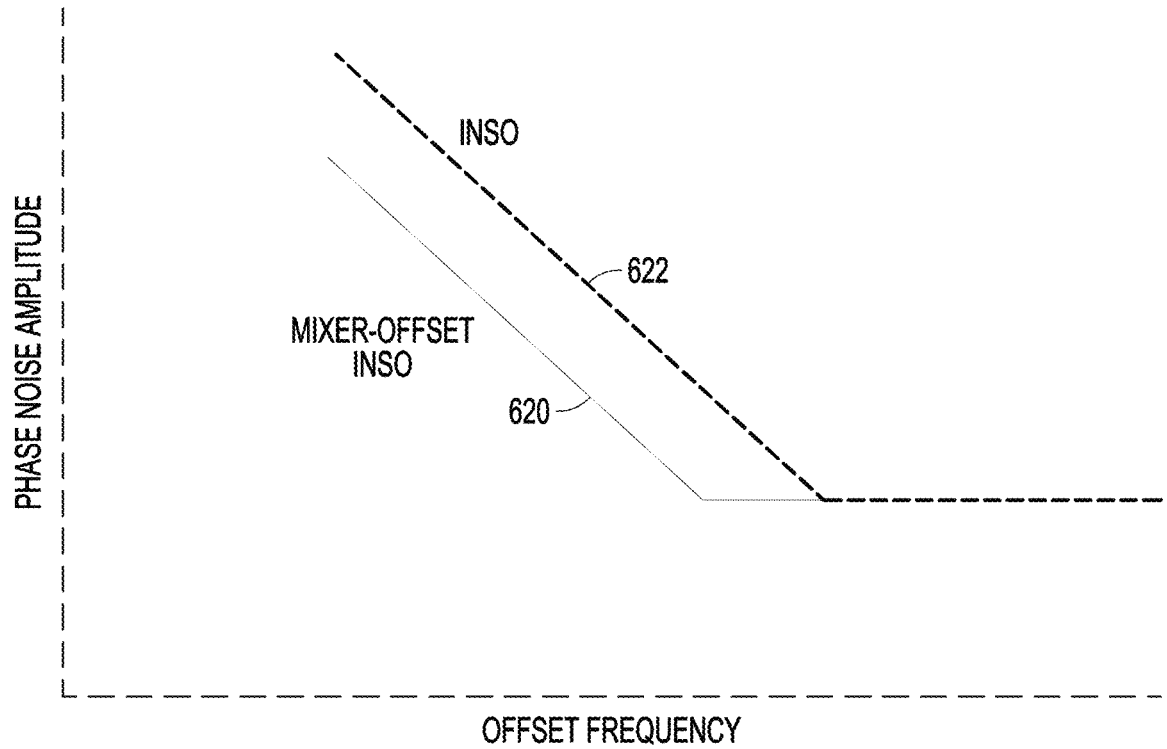

As a result, as shown in FIG. 6B, the mixer-offset INSO phase noise 620, determined by the dominant mixer phase noise contribution, is lower than a standard INSO phase noise 622, determined by the dominant variable attenuator phase noise contribution in the operating region of the INSO.

While several illustrative embodiments of the disclosure have been shown and described, numerous variations and alternate embodiments will occur to those skilled in the art. Such variations and alternate embodiments are contemplated, and can be made without departing from the spirit and scope of the disclosure as defined in the appended claims.

I claim:

1. An offset-mixer interferometric noise suppressed oscillator (INSO), comprising:
   an amplifier, a loop phase shifter responsive to a control signal, and a resonator arranged in a loop to oscillate and produce a first signal at a carrier frequency, a second signal produced by reflection of a portion of the first signal by the resonator;
   an interferometric bridge including a reference arm responsive to a first portion of the first signal and a reflection arm responsive to a portion of the second signal which combine to produce a carrier suppressed signal, said reference arm having a carrier phase and amplitude and said reflection arm having a carrier phase and amplitude;
   a LO variable phase shifter responsive to a second portion of the first signal to produce a phase-shifted LO signal;
   an I/Q mixer responsive to the carrier suppressed signal and the phase-shifted LO signal to produce I and Q channel outputs as amplitude and phase error signals, respectively, of the reflection arm, wherein the LO variable phase shifter is tuned to align the Q-channel output to the reflection arm's carrier phase and the I-channel output to the reflection arm's carrier amplitude;
   said reference arm including a fixed phase shifter and a variable phase shifter, wherein the fixed phase shifter provides a phase shift to align the reference arm's variable phase shifter to the I-channel output, wherein the variable phase shifter is responsive to the I-channel output to nullify the I-channel output; and a control signal generator including an amplification network that amplifies a difference signal between Q-channel output and an externally applied carrier frequency tuning voltage $V_{PLL}$ to provide the control signal to the loop phase shifter to adjust the carrier frequency thereby producing a different reflection phase that appears on the Q-channel output to drive the difference signal towards zero.

2. The offset-mixer INSO of claim 1, wherein $V_{PLL}$ imposes a non-zero offset on the Q-channel output.

3. The offset-mixer INSO of claim 1, wherein the reference arm variable phase shifter nullifies the I-channel output by forcing opposite phase on the reference and reflection arms to drive a power of carrier suppression signal towards zero.

4. The offset-mixer INSO of claim 1, wherein the mixer exhibits a linear response over a tuning range of the carrier frequency, where the tuning range is fixed regardless of a reference arm variable phase shifter operating point.

5. The offset-mixer INSO of claim 1, further comprising a feedback network connected between the mixer's I-channel output and an input to the reference arm variable phase shifter.

6. The offset-mixer INSO of claim 5, wherein the feedback network includes an integrator that integrators the I-channel output.

7. The offset-mixer INSO of claim 5, wherein the feedback network may be either analog or digital.

8. The offset-mixer INSO of claim 1, wherein the amplification network comprises a feedback amplifier and an integrator whose outputs are summed to provide the control signal to the loop phase shifter.

9. The offset-mixer INSO of claim 1, wherein the variable phase shifter is a varactor phase shifter.

10. The offset-mixer INSO of claim 2, wherein the mixer has a phase noise contribution that is the dominant phase noise contributor for the INSO.

11. The offset-mixer INSO of claim 10, wherein the reference arm variable phase shifter has a phase noise contribution whose amplitude exceeds that of the mixer, wherein the reference arm's variable phase shifter is aligned with the I-channel and off-axis to the INSO's phase noise in the Q-channel.

12. The offset-mixer INSO of claim 10, further comprising a low noise amplifier (LNA) that amplifies the carrier suppressed signal, wherein the carrier suppressed signal is offset from zero thereby increasing a phase noise contribution of the LNA, which remains less than the phase noise contribution of the mixer.

13. The offset-mixer INSO of claim 12, further comprising:

a thermal control loop that integrates the non-zero offset on the Q-channel output to adjust the resonator's natural frequency and nullify the Q-channel output thereby suppressing the phase noise contribution of the LNA.

14. An offset-mixer interferometric noise suppressed oscillator (INSO), comprising:

an amplifier, a loop phase shifter responsive to a control signal, and a resonator arranged in a loop to oscillate and produce a first signal at a carrier frequency, a second signal produced by reflection of a portion of the first signal by the resonator;

an interferometric bridge including a reference arm responsive to a first portion of the first signal and a reflection arm responsive to a portion of the second signal which combine to produce a carrier suppressed signal, said reference arm having a carrier phase and amplitude and said reflection arm having a carrier phase and amplitude, and a low noise amplifier (LNA) configured to amplify the carrier suppressed signal;

a LO variable phase shifter responsive to a second portion of the first signal to produce a phase-shifted LO signal;

an I/Q mixer responsive to the amplified carrier suppressed signal and the phase-shifted LO signal to produce I and Q channel outputs as amplitude and phase error signals, respectively, of the reflection arm, wherein the LO variable phase shifter is tuned to align the Q-channel output to the reflection arm's carrier phase and the I-channel output to the reflection arm's carrier amplitude;

said reference arm including a fixed phase shifter and a variable phase shifter, wherein the fixed phase shifter provides a phase shift to align the reference arm's variable phase shifter to the I-channel output, wherein the variable phase shifter is responsive to the I-channel output to nullify the I-channel output; and a control signal generator including an amplification network that amplifies a difference signal between Q-channel output and an externally applied carrier frequency tuning voltage $V_{PLL}$ that imposes a non-zero offset on the mixer's Q-channel output to provide the control signal to the loop phase shifter to adjust the carrier frequency thereby producing a different reflection phase that appears on the Q-channel output to drive the difference signal towards zero, wherein the mixer, reference arm variable phase shifter and LNA each have a phase noise contribution, wherein the reference arm's variable phase shifter is aligned with the I-channel and off-axis to the INSO's phase noise in the Q-channel such that its phase noise contribution is less than the mixer's, wherein the carrier suppressed signal is offset from zero thereby increasing a phase noise contribution of the LNA, which remains less than the phase noise contribution of the mixer, whereby the mixer's phase noise contribution is the dominant phase noise contributor for the INSO.

15. The offset-mixer INSO of claim 14, further comprising:

a thermal control loop that integrates the non-zero offset on the Q-channel output to adjust the resonator's natural frequency and nullify the Q-channel output thereby suppressing the phase noise contribution of the LNA.

16. An offset-mixer interferometric noise suppressed oscillator (INSO), comprising:

an oscillator loop that produces a first signal at a carrier frequency and a second signal as a reflection of the first signal;

a phase detector including an interferometric bridge having reference and reflection arms responsive to the first and second signals, respectively, and combines them to produce a carrier suppressed signal, a LO variable phase shifter responsive to the first signal to produce a phase-shifted LO signal, and an I/Q mixer responsive to the carrier suppressed signal and the phase-shifted LO signal to generate I and Q-output channels;

a fixed phase shift that aligns a variable phase shifter in the reference arm to the mixer's I-channel output, said variable phase shifter responsive to the I-channel output to nullify the I-channel output; and an amplification network responsive to a difference signal between the mixer's Q-channel output and an externally applied carrier frequency tuning voltage $V_{PLL}$ to provide a control signal to the oscillator loop to adjust the carrier frequency, wherein $V_{PLL}$ imposes a non-zero offset on the Q-channel output.

17. The offset-mixer INSO of claim 16, wherein the mixer exhibits a linear response over a tuning range of the carrier frequency, where the tuning range is fixed regardless of a reference arm variable phase shifter operating point.

18. The offset-mixer INSO of claim 16, wherein the mixer, reference arm variable phase shifter each have a phase noise contribution, wherein the reference arm's variable phase shifter is aligned with the I-channel and off-axis to the INSO's phase noise in the Q-channel such that its phase noise contribution is less than the mixer's, whereby the mixer's phase noise contribution is the dominant phase noise contributor for the INSO.

19. The offset-mixer INSO of claim 16, wherein oscillator loop includes a resonator having a natural frequency, further comprising:
   a low noise amplifier (LNA) configured to amplify the carrier suppressed signal at the input to the I/Q mixer, and
   a thermal control loop that integrates the non-zero offset on the Q-channel output to adjust the resonator's natural frequency and nullify the Q-channel output thereby suppressing a phase noise contribution of the LNA.

20. The offset-mixer INSO of claim 16, wherein the LO variable phase shifter is tuned to align the Q-channel output to the reflection arm's carrier phase and the I-channel output to the reflection arm's carrier amplitude.

\* \* \* \* \*